United States Patent
Karnik (10) Patent No.: US 11,449,438 B2
(45) Date of Patent: Sep. 20, 2022

(54) FIELD DEVICE COMPRISING A BUS INTERFACE USING A SURFACE ACOUSTIC WAVE ISOLATOR

(71) Applicant: Endress+Hauser SE+Co. KG, Maulburg (DE)

(72) Inventor: Gautham Karnik, Whitestown, IN (US)

(73) Assignee: ENDRESS+HAUSER SE+CO. KG, Maulburg (DE)

(*) Notice: Subject to any disclaimer, the term of this patent is extended or adjusted under 35 U.S.C. 154(b) by 130 days.

(21) Appl. No.: 17/093,711

(22) Filed: Nov. 10, 2020

(65) Prior Publication Data

US 2022/0147466 A1    May 12, 2022

(51) Int. Cl.
*G06F 13/10* (2006.01)
*G06F 3/043* (2006.01)
*H03H 9/64* (2006.01)

(52) U.S. Cl.
CPC .......... *G06F 13/102* (2013.01); *G06F 3/0436* (2013.01); *H03H 9/64* (2013.01)

(58) Field of Classification Search
CPC ............. G06F 13/4282; G06F 13/4072; G06F 13/4291; G06F 13/4068; G06F 13/385; G06F 11/3051; G06F 11/2289; G06F 13/4022; G05B 19/0423; H04B 1/40
See application file for complete search history.

(56) References Cited

U.S. PATENT DOCUMENTS

2015/0089093 A1* 3/2015 Rhee .................. G06F 11/2289
710/16

* cited by examiner

*Primary Examiner* — John W Poos
(74) *Attorney, Agent, or Firm* — Mark A. Logan; Endress+Hauser (USA) Holding Inc.

(57) ABSTRACT

A field device comprising: a device electronic; a bus interface embodied to connect the field device to a field bus and a surface acoustic wave connecting the device electronic to the bus interface is disclosed. The bus interface includes a bus driver transmitting communication signals corresponding to digital transmission signal provided by the device electronic onto the field bus and a bus receiver receiving communication signals from the bus and providing corresponding digital reception signals to the device electronic. The surface acoustic wave transceiver transmits the digital transmission signals provided by the device electronic to the bus driver and transmits the digital reception signals provided by the bus receiver to the device electronic. Thereby, the surface acoustic wave transceiver galvanically isolates the device electronic from the bus driver and the bus receiver.

15 Claims, 3 Drawing Sheets

FIELD DEVICE COMPRISING A BUS INTERFACE USING A SURFACE ACOUSTIC WAVE ISOLATOR

TECHNICAL FIELD

The present disclosure relates to a field device comprising: a device electronic and a bus interface embodied to connect the field device to a field bus, the bus interface including a bus driver embodied to transmit communication signals corresponding to digital transmission signals provided to the bus driver by the device electronic onto the field bus and a bus receiver embodied to receive communication signals transmitted to the field device via the field bus and to provide corresponding digital reception signals to the device electronic.

BACKGROUND

Field devices of various types are used in a large variety of applications. As an example, field devices are applied in process automation technology to monitor, regulate and/or control operation of industrial sites, as well as to monitor, regulate and/or control at least one process, like e.g. a production process, performed at, on or by the industrial site. Field devices applied for this purpose include measurement devices measuring at least one variable, like e.g. a pressure, a temperature or a flow of a medium, as well as field devices including an actuator, like e.g. a valve or a pump, applied to influence the operation and/or the process.

In process automation, field buses are applied to interconnect field devices and/or to connect field devices to a superordinate unit, like e.g. a control unit, an automation system, or a programmable logical controller, monitoring, regulating and/or to controlling operation of the site and/or at least one process performed at, on or by the industrial site. As an example, a valve may be opened or closed according to a level of a product in a container.

Field devices applied in these application are embodied to communicate over the field bus they are connected to. To this extent, they e.g. include a device electronic and a bus interface embodied to connect the field device to the field bus. The bus interface comprises a bus driver and a bus receiver. The bus driver transmits communication signals corresponding to digital transmission signals provided to the bus driver by the device electronic onto the field bus. The bus receiver receives communication signals transmitted to the field device via the field bus and provides corresponding digital reception signals to the device electronic.

In recent years a variety of different field busses and corresponding communication protocols have been well established in process automation industry. Examples are Profibus, Foundation Fieldbus, Ethernet and Modbus, as well as field busses, wherein communication is performed over a pair of bus lines by superimposing a digital communication signal, like e.g. a digital communication signal according to the Highway Addressable Remote Transducer Communication Protocol (HART), on an analog signal, like e.g. a current varying between 4 mA and 20 mA.

In many applications, the field bus connected to the field devices is also applied to power the field device. Field busses suitable for this purpose include field busses having a set of signal lines for transmitting and receiving communication signals and a separate set of power lines providing power to the field device connected to the field bus, as well as field busses, wherein power and communication signals are transmitted over a single pair of bus lines.

Regardless of whether a field device is powered via the field bus and/or via another power supply connected to the device electronic, for safety reasons, field devices are preferably equipped with a set of isolators galvanically isolating the device electronic from the field bus.

Isolators used for this purpose include signal transformers and power transformers. Examples of signal transformers are optical isolators, like e.g. optocouplers, inserted in signal transmission lines connecting the device electronic to the bus driver, as well as in signal reception lines connecting the bus receiver to the device electronic. Examples of power transformers are inductive isolators, like e.g. planar transformers, regularly applied in power lines providing power supplied by the field bus to the device electronic.

Galvanically isolating the device electronic from the field bus provides the advantage that it prevents a current flow across each isolator, whilst enabling energy and/or information to be exchanged across the respective isolator. Thus, galvanic isolation is a very effective method of breaking ground loops and increases the safety of operation of the field device and the field bus. The latter is especially advantageous, when the field device is applied in hazardous environments.

A disadvantage is however, that each of the isolators required for this purpose constitutes an additional component, that has to be mounted and wired up individually. This increases the manufacturing costs of the field device.

Another disadvantage is, that a considerably large amount of space is required within the field device to accommodate the set of isolators. Due to progress achieved in technology, it has been possible to reduce the size of field devices. In consequence less space is available to accommodate isolators within the field device. Thus, the number and the size of the isolators required has become a limiting factor regarding further miniaturization of field devices.

Accordingly, there remains a need for further contributions in this area of technology.

As an example, there is a need for a field device, wherein galvanic isolation between the device electronic and the field bus connected to or connectable to the field device can be achieved at lower cost and/or requires less space within the field device.

SUMMARY

The present disclosure discloses a field device comprising:
  a device electronic;
  a bus interface embodied to connect the field device to a field bus, the bus interface including a bus driver embodied to transmit communication signals corresponding to digital transmission signal provided by the device electronic onto the field bus and a bus receiver embodied to receive communication signals transmitted to the field device via the field bus and to provide corresponding digital reception signals to the device electronic; and
  a surface acoustic wave transceiver:
    transmitting the digital transmission signals provided to the surface acoustic wave transceiver by the device electronic to the bus driver by converting the respective digital transmission signal into a surface acoustic transmission wave, reconverting the surface acoustic transmission wave back into the digital transmission signal and providing the reconverted digital transmission signal to the bus driver; and
    transmitting the digital reception signals provided to the surface acoustic wave transceiver by the bus receiver to the device electronic by converting the respective digital reception signal into a surface acoustic reception wave, reconverting the surface acoustic reception wave back into the respective digital reception signal and providing the reconverted digital reception signal to the device electronic.

The field device provides the advantage that only a single component given by the surface acoustic wave transceiver is required to provide electrical isolation between the device electronic and the bus driver as well as between the bus receiver and the device electronic.

Another advantage is that the surface acoustic wave transceiver can be implemented in form of a single monolithic integrated circuit. Thus, surface acoustic wave transceivers can be manufactured at lower costs and are much smaller in size than optocouplers, in particular optocouplers constructed of discrete components.

In a first embodiment, the bus interface is connected to the device electronic via the surface acoustic wave transceiver; the surface acoustic wave transceiver constitutes an electric isolator galvanically isolating the device electronic from the bus driver and from the bus receiver; the field device is embodied to communicate over the field bus connected to or connectable to the bus interface; and/or the field device includes a sensor, a measurement probe, a measurement transducer or another type of measurement device connected to the device electronic and measuring at least one variable or includes a valve, a pump or another type of actuator connected to the device electronic.

In a second embodiment, an output of the device electronic providing the digital transmission signals is connected to a first input of the surface acoustic wave transceiver; a first output of the surface acoustic wave transceiver providing the reconverted digital transmission signals is connected to the bus driver; an output of the bus receiver providing the digital reception signals is connected to a second input of the surface acoustic wave transceiver; and a second output of the surface acoustic wave transceiver providing the reconverted digital reception signals is connected to an input of the device electronic receiving the reconverted digital reception signals.

In a third embodiment, the surface acoustic wave transceiver includes a signal transmission path connecting an output of the device electronic providing the digital transmission signals to the field bus driver; along the signal transmission path the surface acoustic wave transceiver includes: a) a signal converter having an input connected to the output of the device electronic and converting the digital transmission signals provided to it into radio frequency signals, b) a primary interdigital transducer located on a first piezoelectric layer, connected to an output of the signal converter and transforming the radio frequency signals provided by the signal converter into surface acoustic transmission waves, c) a secondary interdigital transducer located spaced apart from the primary interdigital transducer on the first piezoelectric layer and transforming the surface acoustic transmission waves transmitted from the primary interdigital transducer along a surface of the first piezoelectric layer to the secondary interdigital transducer into radio frequency signals, and d) an envelope detector connected to an output of the secondary interdigital transducer, reconverting the radio frequency signals provided to it by the secondary interdigital transducer back into the digital transmission signals and providing the reconverted digital transmission signals to the bus driver connected to an output of the envelope detector. In this embodiment, the surface acoustic wave transceiver further includes a signal reception path connecting the bus receiver providing the digital reception signals to the device electronic; and along the signal reception path the surface acoustic wave transceiver includes: a) a signal converter having an input connected to the bus receiver and converting the digital reception signals provided by the bus receiver into radio frequency signals, b) a primary interdigital transducer located on a third piezoelectric layer, connected to an output of the signal converter connected to the bus receiver and transforming the radio frequency signals provided by this signal converter into surface acoustic reception waves, c) a secondary interdigital transducer located spaced apart from the primary interdigital transducer on the third piezoelectric layer and transforming the surface acoustic reception waves transmitted from the primary interdigital transducer along a surface of the third piezoelectric layer to the secondary interdigital transducer back into the radio frequency signals, and d) an envelope detector connected to an output of the secondary interdigital transducer, reconverting the radio frequency signals provided to it by the secondary interdigital transducer back into the digital reception signals and providing the reconverted digital reception signals to the device electronic having an input connected to an output of this envelope detector.

In such an embodiment, the surface acoustic wave transceiver includes an oscillator providing an oscillator signal or an oscillator signal given by a frequency signal having a predetermined frequency or a predetermined frequency of 100 kHz to 2 GHz; the signal converter connected to the device electronic includes a mixer or a radio frequency switch having a first input connected to the output of the device electronic, a second input connected to the oscillator and an output providing the radio frequency signals; and the signal converter connected to the bus receiver includes a mixer or a radio frequency switch having a first input connected to the bus receiver, a second input connected the oscillator and an output providing the radio frequency signals.

In such an embodiment, the mixer or radio frequency switch of the signal converter connected to the bus receiver is galvanically isolated from the oscillator by an isolator or by an isolator including: a primary interdigital transducer located on a second piezoelectric layer, connected to the oscillator and transforming the oscillator signal provided to it into surface acoustic oscillator signal waves; a secondary interdigital transducer located spaced apart from the primary interdigital transducer on the second piezoelectric layer, reconverting the surface acoustic oscillator signal waves transmitted from the primary interdigital transducer along a surface of the second piezoelectric layer to the secondary interdigital transducer back into the oscillator signal and providing the reconverted oscillator signal to the mixer or the radio frequency switch connected to the bus receiver.

In such an embodiment, a balun is inserted between the secondary interdigital transducer located on the second piezoelectric layer and the mixer or the radio frequency switch of the signal converter connected to the bus receiver.

In an embodiment of the field device according to the third embodiment, at least one of or all of: the first piezoelectric layer, the second piezoelectric layer and the third piezoelectric layer is each given by a layer having a rectangular surface, a layer consisting of a piezoelectric quartz, an AT cut piezoelectric quartz, a CT cut piezoelectric quartz or lithium niobite, and/or a layer deposited on a substrate or a silicon substrate; at least one or all of the primary interdigital transducers and the secondary interdigital transducers is each embodied in form of two interlocking comb-shaped electrodes deposited on the respective first, second or third piezoelectric layer; and/or at least one of the envelope detectors includes a rectifier inserted in one of two parallel lines of the respective envelope detector connected to the anteceding secondary interdigital transducer, a capacitor connected in series to the rectifier and inserted in a connecting line connecting the two parallel lines and a resistor connected in parallel to the capacitor and inserted in a second connecting line connecting the two parallel lines.

In another embodiment, the surface acoustic wave transceiver is implemented in an integrated circuit, and/or is given by or included in an integrated circuit, a monolithic integrated circuit, a chip or a microchip including all components of the surface acoustic wave transceiver.

In such an embodiment, the surface acoustic wave transceiver is implemented on a silicon substrate.

In another embodiment, the field device comprises at least one of: an amplifier is inserted in a line connecting the bus receiver to the surface acoustic wave transceiver; an amplifier is inserted in a line connecting the surface acoustic wave transceiver to the bus driver; a high-pass filter or a high-pass filter consisting of or including a capacitor inserted in a first internal line connecting a port of the field device connectable to or connected to a line of the field bus to the bus driver; and a high-pass filter or a high-pass filter consisting of or including a capacitor inserted in a second internal line connecting a port of the field device connectable to or connected to a line of the field bus to the bus receiver.

In such an embodiment, each amplifier is a component of an integrated circuit, a monolithic integrated circuit, a chip or a microchip including the surface acoustic wave transceiver.

In another embodiment, the field device is a battery powered device, a solar powered device, a device powered by a power supply connected to or connectable to the device electronic and/or a device powered via the field bus; and the field bus is a field bus including a set of signal lines including a first signal line connected to or connectable to a transmit port of the field device connected to the bus driver and a second signal line connected to or connectable to a receiving port of the field device connected to the bus receiver.

In another embodiment the field bus includes a set of signal lines and a set of power supply lines; the field device includes a set of internal power supply lines connecting the device electronic to power supply ports of the field device connected to or connectable to the power supply lines of the field bus; and an isolator or a transformer galvanically isolating the power supply ports from the device electronic is inserted in the internal power supply lines.

In another embodiment, the field bus includes a pair of bus lines for communicating and for providing power to the field device; and the field device includes: a first port connected to the bus driver via a first internal line and connected to or connectable to one of the bus lines of the field bus; a second port connected to the bus receiver via second internal line and connected to or connectable to the other one of the bus lines of the field bus; a high-pass filter or a high-pass filter consisting of or including a capacitor inserted in the first internal line; a high-pass filter or a high-pass filter consisting of or including a capacitor inserted in the second internal line; a set of internal power lines including an internal power line connecting the device electronic to the first internal line at a connecting point located between the filter and the first port and an internal power line connecting the device electronic to the second internal line at a connecting point located between the filter and the second port; and an isolator or a transformer inserted in the set of internal power lines and galvanically isolating the device electronic from both the first port and the second port.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein.

DETAILED DESCRIPTION

Figure 1:
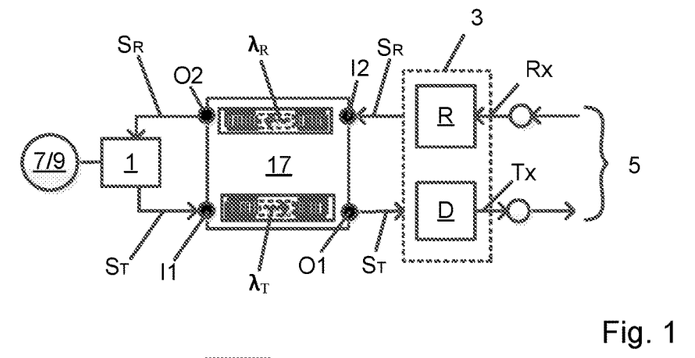
FIG. 1 shows a field device including a surface acoustic wave transceiver.

The present disclosure includes a field device comprising a device electronic 1 and a bus interface 3 embodied to connect the field device to a field bus 5. A block diagram of an example of the field device is shown in FIG. 1. As illustrated in the example, the bus interface 3 includes a bus driver D embodied to transmit communication signals Tx corresponding to digital transmission signal $S_T$ provided to the bus driver D by the device electronic 1 onto the field bus 5 and a bus receiver R embodied to receive communication signals Rx transmitted to the field device via the field bus 5 and to provide corresponding digital reception signals $S_R$ to the device electronic 1.

The field device can be any device applied in the field and embodied to communicate over the field bus connected to or connectable to the bus interface 3. As an example, the field device is e.g. a field device including a measuring device 7 connected to the device electronic 1, like e.g. a sensor, a measurement probe, a measurement transducer or another type of measurement device, measuring at least one variable. As another example the field device is e.g. a field device including an actuator 9 connected to the device electronic 1, like e.g. a valve or a pump or another type of actuator, like e.g. an actuator applied to influence operation of a site or facility and/or to influence a process performed at, on or by the site or facility.

Figure 2:
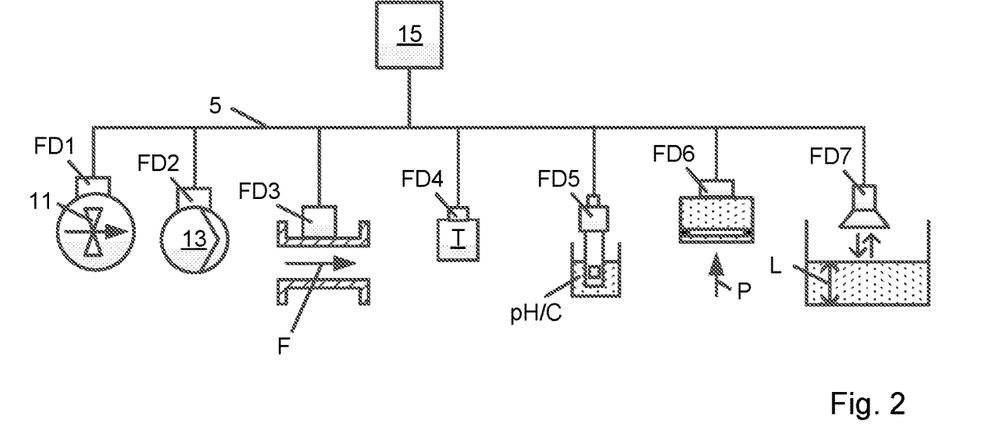
FIG. 2 shows field devices connected to a superordinate unit via a field bus.

As an example the field device is e.g. a field device applied in process automation. FIG. 2 shows a schematic diagram of an example of a typical application, wherein a number of field devices are operated at decentralized locations in the field, e.g. at various different positions distributed across an industrial site. In the example shown, the field devices include a field device FD1 including valve 11 controlling a flow through a pipe, a field device FD2 including a pump 13, a flow meter FD3 measuring a flow F through a pipe, a temperature measurement device FD4 measuring a temperature T, a field device FD5 measuring a pH-value or a concentration C of an analyte included in a medium, a pressure measurement device FD6 measuring a pressure p and a level measurement device FD7 measuring a level L of a medium in a container. In FIG. 2, each field device is connected to at least one other field device and/or to a superordinate unit 15, like e.g. a control unit, an automation system or a programmable logical controller, embodied to monitor, regulate and/or to control operation of the site and/or at least one process performed at, on or by the site. As an example the valve 11 may be opened or closed by the superordinate unit 15 according to the level L measured by the level measurement device FD7 based on corresponding measurement and control signals transmitted over the field bus 5.

The invention is not limited to the field devices shown. Instead it can be applied in the same way regarding any other field device comprising the device electronic 1 and the bus interface 3 enabling the field device to communicate over the field bus.

The field bus 5 is e.g. a field bus known in the art, like e.g. a field bus well established in process automation technology. Examples are Foundation Fieldbus, Profibus, Ethernet and Modbus, as well as field busses, wherein communication is performed by superimposing communication signals, like e.g. digital communication signals according to the Highway Addressable Remote Transducer Communication Protocol (HART), on an analog signal, like e.g. a current varying between 4 mA and 20 mA.

The bus interface 3 is e.g. embodied to bi-directionally communicate over the field bus 5 according to a predefined communication protocol defined for the field bus 5 applied. Bus drivers D and bus receivers R suitable for this purpose and corresponding communication protocols are well known in the art and thus not described in detail herein.

Regardless of the type of field bus applied, the field device includes a surface acoustic wave transceiver 17 connecting the device electronic 1 to the bus interface 3.

The surface acoustic wave transceiver 17 transmits digital transmission signals $S_T$ provided to the surface acoustic wave transceiver 17 by the device electronic 1 to the bus driver D. To this extent, the surface acoustic wave transceiver 17 converts the respective digital transmission signal $S_T$ into a surface acoustic transmission wave $\lambda_T$, reconverts the surface acoustic transmission wave $\lambda_T$ back into the digital transmission signal $S_T$ and provides the reconverted digital transmission signal $S_T$ to the bus driver D. The bus driver D transforms the reconverted digital transmission signal $S_T$ into a corresponding communication signal Tx and transmits the communication signal Tx onto the field bus 5.

In the opposite direction, the bus receiver R transforms communication signals Rx receiver via the field bus 5 into corresponding digital reception signals $S_R$ and provides the digital reception signals $S_R$ to the surface acoustic transceiver 17. Further, the surface acoustic wave transceiver 17 transmits the digital reception signals $S_R$ provided to it by the bus receiver R to the device electronic 1. To this extent, the surface acoustic wave transceiver 17 converts the respective digital reception signal $S_R$ into a surface acoustic reception wave $\lambda_R$, reconverts the surface acoustic reception wave $\lambda_R$ into the respective digital reception signal $S_R$ and provides the reconverted digital reception signal $S_R$ to the device electronic 1.

The surface acoustic wave transceiver 17 connecting the bus interface 3 to the device electronic 1 is e.g. inserted in two signal lines connecting the device electronic 1 to the bus driver D and to the bus receiver R. In this case, an output of the device electronic 1 providing the digital transmission signals $S_T$ is connected to a first input I1 of the surface acoustic wave transceiver 17 and a first output O1 of the surface acoustic wave transceiver 17 providing the reconverted digital transmission signals $S_T$ is connected to the bus driver D. In the opposite direction, an output of the bus receiver R providing the digital reception signals $S_R$ is connected to a second input I2 of the surface acoustic wave transceiver 17 and a second output O2 of the surface acoustic wave transceiver 17 providing the reconverted digital reception signals $S_R$ is connected to an input of the device electronic 1 receiving the reconverted digital reception signals $S_R$.

Due to the conversion of the digital transmission signals $S_T$ into the surface acoustic transmission waves $\lambda_T$ and the conversion of the digital reception signals $S_R$ into the surface acoustic reception waves $\lambda_R$ the surface acoustic wave transceiver 17 constitutes an electric isolator galvanically isolating the device electronic 1 from the bus driver D and from the bus receiver R.

The invention provides the advantages mentioned above. Individual parts of the field device can be implemented in different ways without deviating from the scope of the invention.

Figure 3:
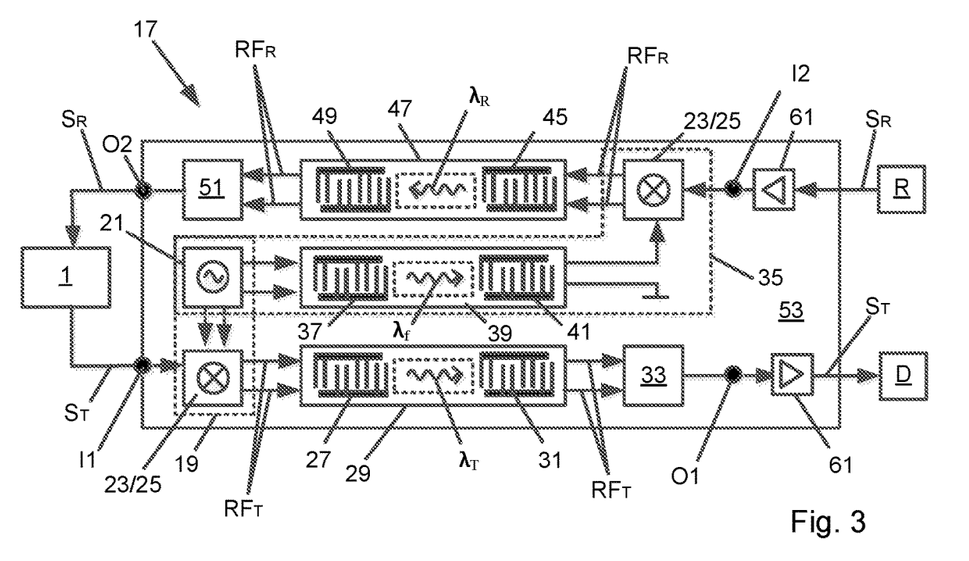
FIG. 3 shows a surface acoustic wave transceiver.

As an example, the surface acoustic wave transceiver 17 can be any transceiver embodied to perform the conversion and the reconversion of the digital transmission signals $S_T$ and of the digital reception signals $S_R$. An example is shown in FIG. 3. This surface acoustic wave transceiver 17 includes a signal transmission path extending from the first input I1 of the surface acoustic wave transceiver 17 connected to the output of the device electronic 1 providing the digital transmission signals $S_T$ through the surface acoustic wave transceiver 17 to the first output O1 of the surface acoustic wave transceiver 17 connected to the bus driver D. Along the signal transmission path, the surface acoustic wave transceiver 17 includes a signal converter 19 having an input connected to the output of the device electronic 1 and converting the digital transmission signals $S_T$ provided by the device electronic 1 into radio frequency signals $RF_T$.

In the example shown, the surface acoustic wave transceiver 17 includes an oscillator 21 generating an oscillator signal, e.g. a frequency signal having a predetermined frequency, like e.g. a predetermined frequency of 100 KHz to 2 GHz, and the signal converter 19 comprises a mixer 23 having a first input connected to the output of the device electronic 1, a second input connected to the oscillator 21 and an output providing the radio frequency signal $RF_T$ obtained by mixing the digital transmission signals $S_T$ and the oscillator signal. As an example, the mixer 23 is e.g. a balanced mixer or an unbalanced mixer.

As an alternative option, a radio frequency switch 25 is e.g. applied instead of the mixer 23 shown in FIG. 3. In this case, the a radio frequency switch 25 is opened and closed according to the signal levels of the digital transmission signals $S_T$ provided to the first input of the signal converter 19 such that the oscillator signal passes through the radio frequency switch 25 to the output of the signal converter 19 whilst the radio frequency switch 25 is open and is prevented from passing through to the output of the signal converter 19 whilst the radio frequency switch 25 is closed.

The output of the signal converter 19 is connected to a primary interdigital transducer 27 located on a first piezoelectric layer 29. The primary interdigital transducer 27 transforms the radio frequency signals $RF_T$ provided to it by the signal converter 19 into the surface acoustic transmission waves $\lambda_T$. The thus generated surface acoustic transmission waves $\lambda_T$ travel along a surface of the first piezoelectric layer 29 to a secondary interdigital transducer 31 transforming the surface acoustic transmission waves $\lambda_T$ back into the radio frequency signals $RF_T$. To this extent, the secondary interdigital transducer 31 is located on the first piezoelectric layer 29 in a position, that is spaced apart from the primary interdigital transducer 27.

Further, an envelope detector 33 is connected to an output of the secondary interdigital transducer 31. The envelope detector 33 reconverts the radio frequency signals $RF_T$ provided to it by the secondary interdigital transducer 31 back into the digital transmission signals $S_T$. In addition, the envelope detector 33 provides the reconverted digital transmission signals $S_T$ to the bus driver D connected to an output of the envelope detector 33.

The surface acoustic wave transceiver 17 shown in FIG. 3 further includes a signal reception path extending from the second input I2 of the surface acoustic wave transceiver 17 connected to the bus receiver R through the surface acoustic wave transceiver 17 to the second output O2 of the surface acoustic wave transceiver 17 connected to the device electronic 1.

Along the signal reception path, the surface acoustic wave transceiver 17 includes a signal converter 35 having an input connected to the bus receiver R and converting the digital reception signals $S_R$ provided by the bus receiver R into the radio frequency signals $RF_R$.

Just like the signal converter 19 inserted in the signal transmission path, the signal converter 35 inserted in the signal reception path e.g. includes a mixer 23, e.g. a balanced mixer or an unbalanced mixer, or a radio frequency switch 25. In this case the mixer 23 or the radio frequency switch 25 applied instead of the mixer 23 comprises a first input connected to the bus receiver R and a second input connected to an oscillator providing an oscillator signal.

As an option, the oscillator 21 of the signal converter 19 inserted in the signal transmission path is used for this purpose. In this case, the oscillator signal provided by this oscillator 21 is additionally provided to the mixer 23 or radiofrequency switch 25 of the signal converter 35 connected to the bus receiver R. This provides the advantage, that only a single oscillator is required.

In this case, the oscillator 21 is galvanically isolated from the mixer 23 or radio frequency switch 25 of the signal converter 35 applied along the signal reception path. An example of a suitable isolator is shown in FIG. 3. In this example, the oscillator 21 is connected to a primary interdigital transducer 37 located on a second piezoelectric layer 39. This primary interdigital transducer 37 transforms the oscillator signal provided to it into surface acoustic oscillator signal waves $\lambda_f$. The thus generated surface acoustic oscillator signal waves $\lambda_f$ travel along a surface of the second piezoelectric layer 39 to a secondary interdigital transducer 41 reconverting the surface acoustic oscillator signal waves $\lambda_f$ back into the oscillator signal. To this extent, the secondary interdigital transducer 41 is located on the second piezoelectric layer 39 in a position, that is spaced apart from the primary interdigital transducer 37 located on the second piezoelectric layer 39.

As shown in FIG. 3 the oscillator signal available at the output of the secondary interdigital transducer 41 is e.g. supplied to the mixer 23 or the radio frequency switch 25 of the signal converter 35 connected to the bus receiver R directly. In this case an output of the secondary interdigital transducer 41 is connected to the second input of the mixer 23 or the radio frequency switch 25.

Figure 4:
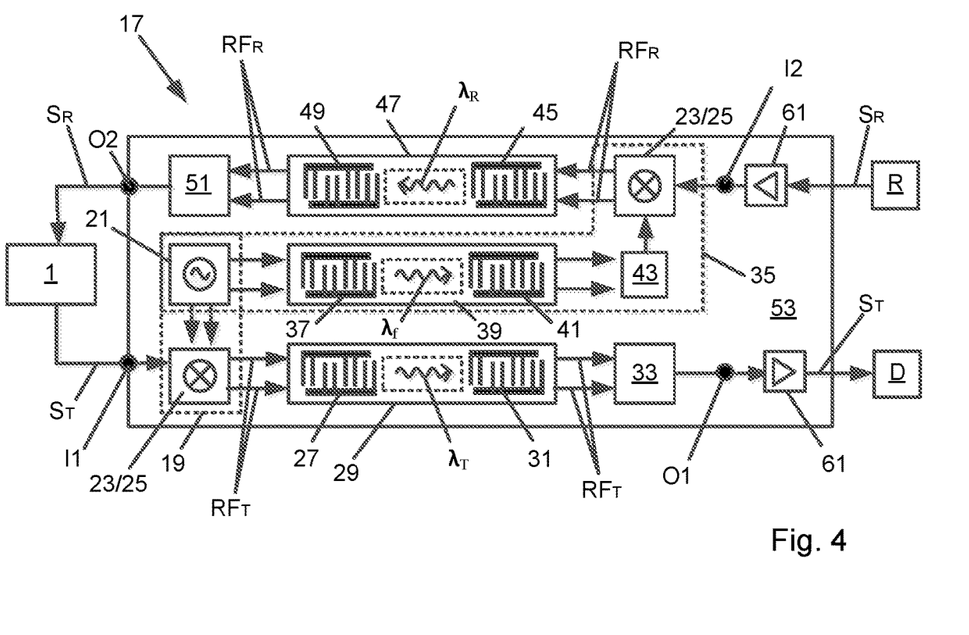
FIG. 4 shows a surface acoustic wave transceiver comprising a balun.
Figure 5:
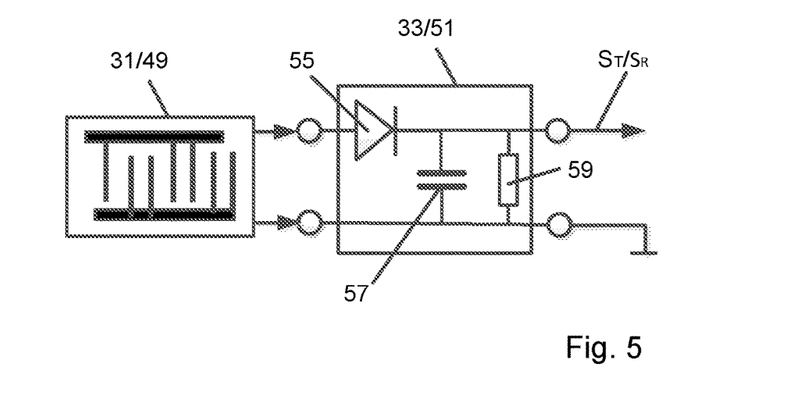
FIG. 5 shows an example of an envelope detector.

As an alternative option, FIG. 4 shows an embodiment of the surface acoustic wave transceiver 17, differing from the embodiment shown in FIG. 3 only in that a balun 43 is inserted in between the secondary interdigital transducer 41 located on the second piezoelectric layer 39 and the mixer 23 or the radio frequency switch 25 of the signal converter 35 connected to the bus receiver R.

Regardless of the type of signal converter 35 applied in the signal reception path, an output of this signal converter 35 is connected to a primary interdigital transducer 45 located on a third piezoelectric layer 47. This primary interdigital transducer 47 transforms the radio frequency signals $RF_R$ provided to it by the signal converter 35 into the surface acoustic reception waves $\lambda_R$. The thus generated surface acoustic reception waves $\lambda_R$ travel along a surface of the third piezoelectric layer 47 to a secondary interdigital transducer 49 transforming the surface acoustic reception waves $\lambda_R$ back into the radio frequency signals $RF_R$. To this extent, the secondary interdigital transducer 49 is located on the third piezoelectric layer 47 in a position, that is spaced apart from the primary interdigital transducer 45 located on the third piezoelectric layer 47.

Further, an envelope detector 51 is connected to an output of the secondary interdigital transducer 49. The envelope detector 51 reconverts the radio frequency signals $RF_R$ provided to it by the secondary interdigital transducer 49 back into the digital reception signals $S_R$ and provides the reconverted digital reception signals $S_R$ to the device electronic 1 connected to an output of the envelope detector 51.

As an option, at least one of or all of: the first piezoelectric layer 29, the second piezoelectric layer 39 and the third piezoelectric layer 47 are e.g. each given by a layer having a rectangular surface and/or a layer consisting of a piezoelectric quartz or lithium niobite. As an example, an AT cut piezoelectric quartz or a CT cut piezoelectric quartz can be used. As an option, at least one or all of the layers are e.g. deposited on a substrate 53, like e.g. a silicon substrate.

As an additional or alternative option, at least one or all of the primary interdigital transducers 27, 37 45 and/or at least one or all of the secondary interdigital transducers 31, 41, 49 are e.g. each embodied in form of two interlocking comb-shaped electrodes deposited on the respective first, second or third piezoelectric layer 29, 39 or 47.

As an example, the envelope detector 33 inserted in the signal transmission path and/or the envelope detector 51 inserted in the signal reception path are e.g. embodied as shown in FIG. 4 in form of a detector comprising a rectifier 55 inserted in one of two parallel lines of the envelope detector 33, 51 connected to the anteceding secondary interdigital transducer 31, 49, a capacitor 57 connected in series to the rectifier 55 and inserted in a connecting line connecting the two parallel lines and a resistor 59 connected in parallel to the capacitor 57 and inserted in a second connecting line connecting the two parallel lines. As an alternative another type of envelope detector can be applied instead.

As an additional or alternative option, the surface acoustic wave transceiver 17 is e.g. implemented in an integrated circuit. In this case the acoustic wave transceiver 17 is e.g. given by or included in a monolithic integrated circuit, a chip or a microchip including all components of the surface acoustic wave transceiver 17.

As an example, the entire circuitry of the surface acoustic wave transceiver 17 including the two signal converters 19, 35 including the oscillator 21 and both envelope detectors 33, 51, are e.g. all implemented on the same substrate 53. In this case the first piezoelectric layer 29, the second piezoelectric layer 39 and the third piezoelectric layer 47, each carrying one of the primary interdigital converters 27, 37, 45 and one of the secondary interdigital converters 31, 41, 49 are layers deposited on a top surface of this substrate 35. As an example, they are e.g. deposited on the substrate 53 by performing a method of Chemical Vapor Deposition, Metal Organic Chemical Vapor Deposition, or Molecular Beam Epitaxy.

In particular due to the comparatively low frequencies of the radio frequency signal $RF_T$, RTR corresponding to the frequency of the oscillator signal, the substrate 53 can be a substrate consisting of a material widely used in semiconductor technology. These materials are available at low cost. As an example the substrate 53 is e.g. a substrate consisting of silicon. As an additional or alternative option, larger numbers of surface wave acoustic transceivers 17 are e.g. manufactured on substrates 53 each given by a fraction of a silicon wafer, on which several surface acoustic wave transceivers 17 are manufactured simultaneously.

Integration of the entire surface acoustic transceiver 17 in a single integrated circuit provides the advantage, that it results in electronic circuitry that is orders of magnitude smaller, faster and less expensive than corresponding circuitry constructed of discrete components. Thus, it reduces the manufacturing cost of the field device and the space required within the field device for accommodating the surface acoustic transceiver 17 providing electric isolation along both signal transmission path and the signal reception path. Correspondingly the size of the entire field device can be reduced accordingly.

As an additional or alternative option illustrated in FIGS. 3 and 4, the field device e.g. includes an amplifier 61 inserted in a line connecting the bus receiver R to the surface acoustic wave transceiver 17 and/or an amplifier 61 inserted in a line connecting the surface acoustic wave transceiver 17 to the bus driver D. FIGS. 3 and 4 show one amplifier 61 inserted in the line connecting the field bus receiver R to the signal converter 35 positioned along the signal reception path of the acoustic wave transceiver 17 and one amplifier 61 inserted in the line connecting the envelope detector 33 positioned along the signal transmission path to the field bus driver D. As an example, amplifiers 61 having a predetermined power gain greater than 1 and/or amplifiers 61 having an automatic gain control can be used for this purpose.

The amplifiers 61 provide the advantage, that by means of these amplifiers 61, power losses associated with the conversion and the reconversion of the digital transmission signals $S_T$ and the digital reception signals $S_R$, in particular power losses due to the attenuation of the surface acoustic transmission waves $\lambda_T$ travelling along first piezoelectric layer 29 and the surface acoustic reception waves $\lambda_R$ travelling along the third piezoelectric layer 47, are easily compensated for.

As an option, each amplified 61 is e.g. implemented as a component of the integrated circuit including the surface acoustic wave transceiver 17. This provides the advantage, that the costs associated with providing and wiring up the amplifiers 61 and the space required to accommodate them within the field device are extremely small.

The field device can be a field device powered via the field bus 5, powered via a power supply Vc connected to the device electronic 1 and/or powered via a combination of the two.

Figure 6:
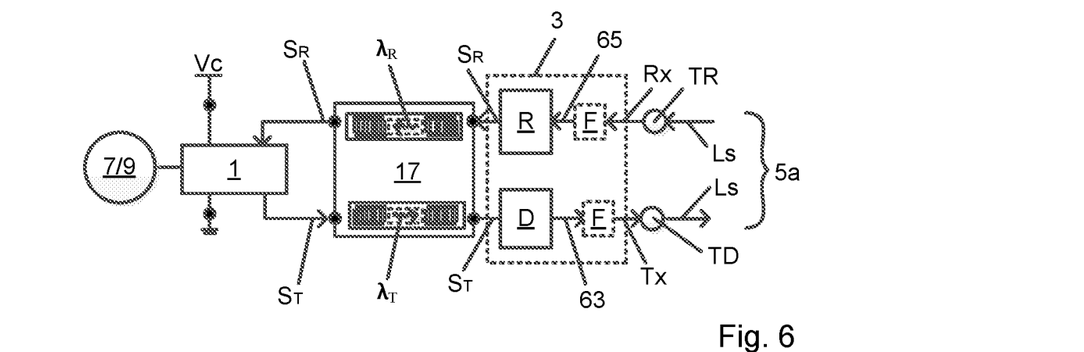
FIG. 6 shows a field device powered by a power supply connected to the device electronic.

FIG. 6 shows an example, wherein the field device is powered by a power supply Vc connected to the device electronic 1. When the field device is a battery or a solar powered device, the power supply Vc, is e.g. provided by a battery or a battery connected to a solar power collector charging the battery. As an alternative, the device electronic 1 e.g. comprises a power supply unit connectable to or connected to an external power supply, like e.g. the mains.

In the example shown in FIG. 6, the field bus 5 is a field bus 5a solely applied for bi-directional communication to and from the field device. Thus, it is sufficient for the field bus 5a to have a first signal line Ls connected to or connectable to a transmit port TD of the field device and a second signal line Ls connected to or connectable to a receiving port TR of the field device. In this case, the field bus 5a is e.g. a MODBUS on RS485 or an Ethernet bus. Within the field device, the a transmit port TD is connected to the bus driver D and the receiving port TR is connected to the bus receiver R.

Figure 7:
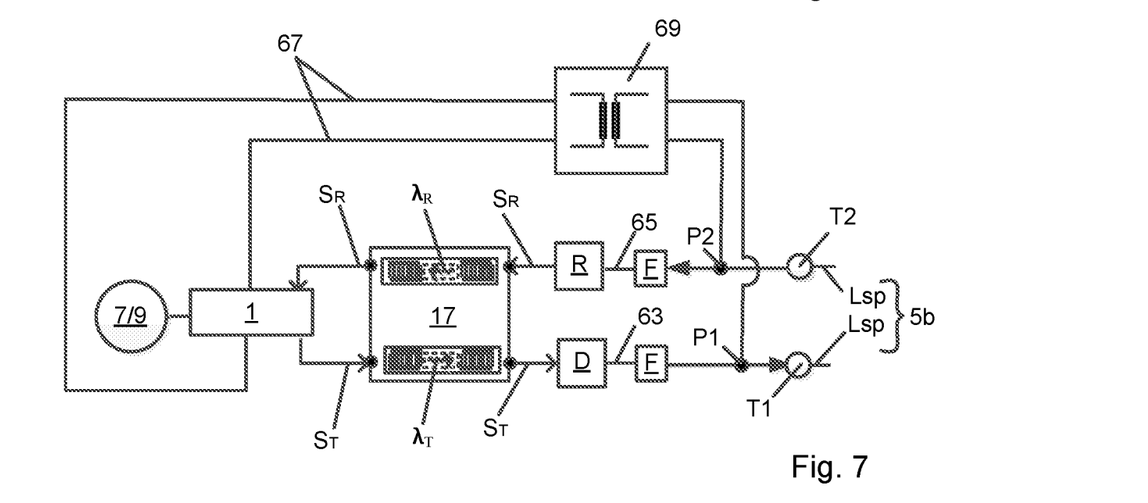
FIG. 7 shows a field device powered by a field bus comprising a pair of lines.
Figure 8:
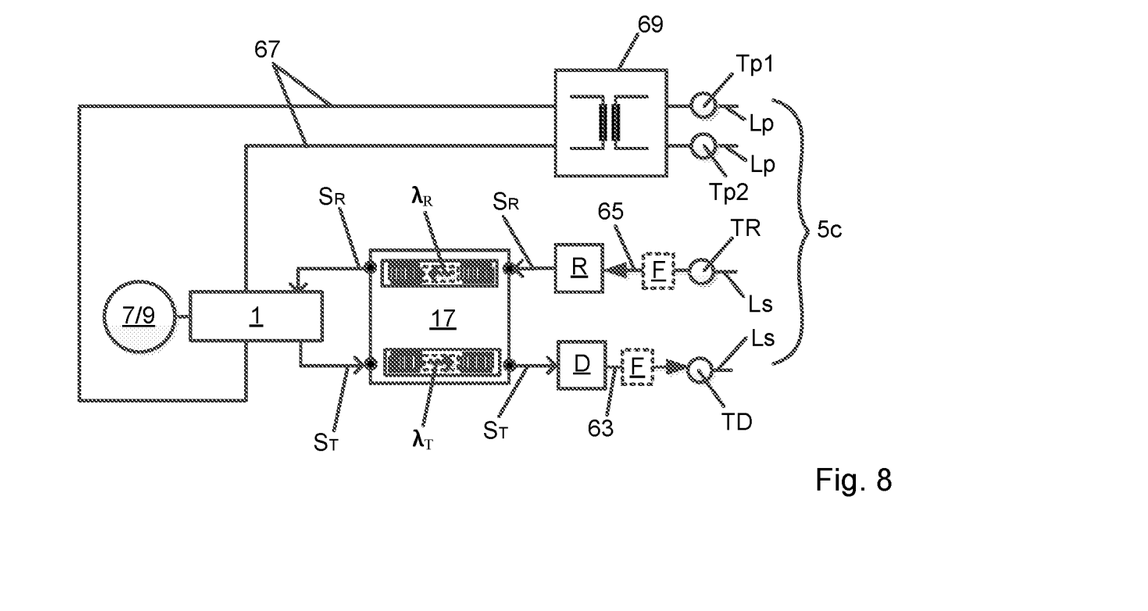
FIG. 8 shows a field device powered by a field bus comprising a set of signal lines and a set of power lines.

FIGS. 7 and 8 each show an example where the field device is powered by the field bus 5.

In FIG. 7, the field bus 5 is a field bus 5b comprising of a pair of bus lines Lsp applied for providing power and for bidirectional communication. This is e.g. the case, when the field bus 5b is bus wherein communication is performed over the pair of lines Lsp by superimposing the communication signals Tx, Rx, like e.g. digital communication signals according to the Highway Addressable Remote Transducer Communication Protocol (HART), on an analog signal, like e.g. a current flowing over the pair of lines Lsp, like e.g. a current varying between 4 mA and 20 mA. Each of the bus lines Lsp is connected to or connectable to one of the ports of the field device. As shown, the ports comprise a first port T1 connected to the bus driver D via a first internal line 63 and a second port T2 connected to the bus receiver R via a second internal line 65.

When a pair of bus lines Lsp is applied for providing power and for bidirectional communication, as shown in FIG. 7, a high-pass filter F, like e.g. a filter consisting of or including a capacitor, is inserted in the first internal line 63 and in the second internal line 65.

The filter F in the first internal line 63 provides the advantage, that it blocks DC from the field device from entering the field bus 5b. The filter F inserted in the second internal line 65 provides the advantage, that it blocks DC from entering the bus receiver R.

The field device shown in FIG. 7 includes a set of internal power lines 67. One of them connects the device electronic 1 to the first internal line 63 at a connecting point P1 located between the filter F and the first port T1 and the other one connects the device electronic 1 to the second internal line 65 at a connecting point P2 located between the filter F and the second port T2. In addition, an isolator 69, like e.g. a transformer, galvanically isolating the device electronic 1 from both the first port T1 and the second port T2 is inserted in the set of internal power lines 67.

In FIG. 8, the field bus 5 is a field bus 5c comprising a set of power supply lines Lp and a separate set of signal lines Ls. This is case, the field bus 5c is e.g. a PROFIBUS or an Ethernet bus.

In the example shown, the field device includes two power supply ports Tp1, Tp2, each connected to or connectable to one of the two power supply lines Lp of the field bus 5c and signal ports, each connected or connectable to one of the signal lines Ls of the field bus 5c. Within the field device, the power supply terminals Tp1, Tp2 are connected to the device electronic 1 via a set of internal power supply lines 67 and an electric isolator 69, like e.g. a transformer, galvanically isolating the device electronic 1 from the power supply ports Tp1, Tp2 is inserted in the internal power lines 67. The signal ports include a transmit port TD connected to the bus driver D and a receiving port TR connected to the bus receiver R.

As an option, the filter F inserted in the internal line 63 connecting the bus driver D to the transmit port TD and/or the filter F inserted in the internal line 65 connecting receiving port TR to the bus receiver R described above in context with the field device shown in FIG. 7 are e.g. also foreseen in the corresponding internal lines 63, 65 of the field device shown in FIG. 6 and/or the field device shown in FIG. 8.

What is claimed is:

1. A field device comprising:
a device electronic;
a bus interface embodied to connect the field device to a field bus, the bus interface including a bus driver embodied to transmit communication signals corresponding to digital transmission signals provided by the device electronic onto the field bus and further including a bus receiver embodied to receive communication signals transmitted to the field device via the field bus and to provide corresponding digital reception signals to the device electronic; and
a surface acoustic wave transceiver,
wherein the surface acoustic wave transceiver is configured to transmit the digital transmission signals provided to the surface acoustic wave transceiver by the device electronic to the bus driver by converting the respective digital transmission signal into a surface acoustic transmission wave, reconverting the surface acoustic transmission wave back into the digital transmission signal, and providing the reconverted digital transmission signal to the bus driver, and
wherein the surface acoustic wave transceiver is further configured to transmit the digital reception signals provided to the surface acoustic wave transceiver by the bus receiver to the device electronic by converting the respective digital reception signal into a surface acoustic reception wave, reconverting the surface acoustic reception wave back into the respective digital reception signal, and providing the reconverted digital reception signal to the device electronic.

2. The field device of claim 1, wherein:
the bus interface is connected to the device electronic via the surface acoustic wave transceiver;
the surface acoustic wave transceiver constitutes an electric isolator galvanically isolating the device electronic from the bus driver and from the bus receiver;
the field device is embodied to communicate over the field bus connected to or connectable to the bus interface; and
the field device includes a sensor, a measurement probe, a measurement transducer or another type of measurement device connected to the device electronic and measuring at least one variable or includes a valve, a pump or another type of actuator connected to the device electronic.

3. The field device of claim 1, wherein:
an output of the device electronic providing the digital transmission signals is connected to a first input of the surface acoustic wave transceiver;
a first output of the surface acoustic wave transceiver providing the reconverted digital transmission signals is connected to the bus driver;
an output of the bus receiver providing the digital reception signals is connected to a second input of the surface acoustic wave transceiver; and
a second output of the surface acoustic wave transceiver providing the reconverted digital reception signals is connected to an input of the device electronic receiving the reconverted digital reception signals.

4. The field device of claim 1, wherein:
the surface acoustic wave transceiver includes a signal transmission path connecting an output of the device electronic providing the digital transmission signals to the field bus driver;
along the signal transmission path, the surface acoustic wave transceiver further includes:
a signal converter having an input connected to the output of the device electronic and converting the digital transmission signals provided to it into radio frequency signals
a primary interdigital transducer located on a first piezoelectric layer, connected to an output of the signal converter and transforming the radio frequency signals provided by the signal converter into surface acoustic transmission waves;
a secondary interdigital transducer located spaced apart from the primary interdigital transducer on the first piezoelectric layer and transforming the surface acoustic transmission waves transmitted from the primary interdigital transducer along a surface of the first piezoelectric layer to the secondary interdigital transducer into the radio frequency signals; and
an envelope detector connected to an output of the secondary interdigital transducer, reconverting the radio frequency signals provided to it by the secondary interdigital transducer back into the digital transmission signals and providing the reconverted digital transmission signals to the bus driver connected to an output of the envelope detector;
the surface acoustic wave transceiver further includes a signal reception path connecting the bus receiver providing the digital reception signals to the device electronic; and
along the signal reception path, the surface acoustic wave transceiver further includes:
a signal converter having an input connected to the bus receiver and converting the digital reception signals provided by the bus receiver into radio frequency signals;
a primary interdigital transducer located on a third piezoelectric layer, connected to an output of the signal converter connected to the bus receiver and transforming the radio frequency signals provided by this signal converter into surface acoustic reception waves;
a secondary interdigital transducer located spaced apart from the primary interdigital transducer on the third piezoelectric layer and transforming the surface acoustic reception waves transmitted from the primary interdigital transducer along a surface of the third piezoelectric layer to the secondary interdigital transducer back into the radio frequency signals; and
an envelope detector connected to an output of the secondary interdigital transducer, reconverting the radio frequency signals provided to it by the secondary interdigital transducer back into the digital reception signals and providing the reconverted digital reception signals to the device electronic having an input connected to an output of this envelope detector.

5. The field device of claim 4, wherein:
the surface acoustic wave transceiver further includes an oscillator providing an oscillator signal or an oscillator signal given by a frequency signal having a predetermined frequency or a predetermined frequency of 100 kHz to 2 GHz, the signal converter connected to the device electronic includes a mixer or a radio frequency switch having a first input connected to the output of the device electronic, a second input connected to the oscillator and an output providing the radio frequency signals, and the signal converter connected to the bus receiver includes a mixer or a radio frequency switch having a first input connected to the bus receiver, a second input connected the oscillator and an output providing the radio frequency signals.

6. The field device of claim 5, wherein:

the mixer or radio frequency switch of the signal converter connected to the bus receiver is galvanically isolated from the oscillator by an isolator including:

a primary interdigital transducer located on a second piezoelectric layer, connected to the oscillator and transforming the oscillator signal provided to it into surface acoustic oscillator signal waves; and a secondary interdigital transducer located spaced apart from the primary interdigital transducer on the second piezoelectric layer, reconverting the surface acoustic oscillator signal waves transmitted from the primary interdigital transducer along a surface of the second piezoelectric layer to the secondary interdigital transducer back into the oscillator signal and providing the reconverted oscillator signal to the mixer or the radio frequency switch connected to the bus receiver.

7. The field device of claim 6, wherein a balun is inserted between the secondary interdigital transducer located on the second piezoelectric layer and the mixer or the radio frequency switch of the signal converter connected to the bus receiver.

8. The field device of claim 4, wherein:

at least one of or all of: the first piezoelectric layer, the second piezoelectric layer, and the third piezoelectric layer is each given by a layer having a rectangular surface, a layer consisting of a piezoelectric quartz, an AT cut piezoelectric quartz, a CT cut piezoelectric quartz or lithium niobite, and/or a layer deposited on a substrate or a silicon substrate;

at least one or all of the primary interdigital transducers and the secondary interdigital transducers is each embodied in form of two interlocking comb-shaped electrodes deposited on the respective first, second or third piezoelectric layer; and at least one of the envelope detectors includes a rectifier inserted in one of two parallel lines of the respective envelope detector connected to the anteceding secondary interdigital transducer, a capacitor connected in series to the rectifier and inserted in a connecting line connecting the two parallel lines and a resistor connected in parallel to the capacitor and inserted in a second connecting line connecting the two parallel lines.

9. The field device of claim 1, wherein the surface acoustic wave transceiver:

is implemented in an integrated circuit, or is given by or included in an integrated circuit, a monolithic integrated circuit, a chip or a microchip including all components of the surface acoustic wave transceiver.

10. The field device of claim 9, wherein: the surface acoustic wave transceiver is implemented on a silicon substrate.

11. The field device of claim 1, comprising at least one of:

an amplifier inserted in a line connecting the bus receiver to the surface acoustic wave transceiver;

an amplifier inserted in a line connecting the surface acoustic wave transceiver to the bus driver;

a high-pass filter or a high-pass filter consisting of or including a capacitor inserted in a first internal line connecting a port of the field device connectable to or connected to a line of the field bus to the bus driver; and a high-pass filter or a high-pass filter consisting of or including a capacitor inserted in a second internal line connecting a port of the field device connectable to or connected to a line of the field bus to the bus receiver.

12. The field device of claim 11, wherein each amplifier is a component of an integrated circuit, a monolithic integrated circuit, a chip or a microchip including the surface acoustic wave transceiver.

13. The field device of claim 1, wherein:

the field device is a battery powered device, a solar powered device, a device powered by a power supply connected to or connectable to the device electronic and/or a device powered via the field bus; and the field bus is a field bus including a set of signal lines including a first signal line connected to or connectable to a transmit port of the field device connected to the bus driver and a second signal line connected to or connectable to a receiving port of the field device connected to the bus receiver.

14. The field device of claim 1, wherein:

the field bus includes a set of signal lines and a set of power supply lines;

the field device includes a set of internal power supply lines connecting the device electronic to power supply ports of the field device connected to or connectable to the power supply lines of the field bus; and an isolator or a transformer galvanically isolating the power supply ports from the device electronic is inserted in the internal power supply lines.

15. The field device of claim 1, wherein:

the field bus includes a pair of bus lines for communicating and for providing power to the field device; and the field device includes:

a first port connected to the bus driver via a first internal line and connected to or connectable to one of the bus lines of the field bus;

a second port connected to the bus receiver via second internal line and connected to or connectable to the other one of the bus lines of the field bus;

a high-pass filter or a high-pass filter consisting of or including a capacitor inserted in the first internal line;

a high-pass filter or a high-pass filter consisting of or including a capacitor inserted in the second internal line;

a set of internal power lines including an internal power line connecting the device electronic to the first internal line at a connecting point located between the filter and the first port and an internal power line connecting the device electronic to the second internal line at a connecting point located between the filter and the second port; and an isolator or a transformer inserted in the set of internal power lines and galvanically isolating the device electronic from both the first port and the second port.

\* \* \* \* \*